United States Patent
Park et al.

(10) Patent No.: US 8,314,428 B2
(45) Date of Patent: Nov. 20, 2012

(54) THIN FILM TRANSISTOR WITH LDD/OFFSET STRUCTURE

(75) Inventors: Ji Yong Park, Suwon (KR); Ki Yong Lee, Yongin (KR); Hye Hyang Park, Suwon (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 10/734,162

(22) Filed: Dec. 15, 2003

(65) Prior Publication Data

US 2004/0124480 A1    Jul. 1, 2004

(30) Foreign Application Priority Data

Dec. 16, 2002 (KR) .................. 10-2002-0080326

(51) Int. Cl.
*H01L 27/14* (2006.01)

(52) U.S. Cl. ............... 257/72; 257/49; 257/64; 257/66; 257/75; 257/E21.133; 257/E21.316; 257/E29.003; 257/E29.202; 257/E29.273; 257/E29.292

(58) Field of Classification Search .......... 257/64, 257/70, 75, E29.003, 49, 66, 72, E21.133, 257/E21.316, E29.202, E29.273, E29.292, 257/59; 438/166

See application file for complete search history.

(56) References Cited

U.S. PATENT DOCUMENTS

| | | | | |
|---|---|---|---|---|
| 5,382,537 A * | 1/1995 | Noguchi | ........................ | 438/162 |
| 5,563,426 A * | 10/1996 | Zhang et al. | .................... | 257/66 |
| 5,858,823 A | 1/1999 | Yamazaki et al. | | |
| 6,177,301 B1 | 1/2001 | Jung | | |
| 6,184,541 B1 | 2/2001 | Oka et al. | | |
| 6,188,085 B1 * | 2/2001 | Shimizu et al. | ................ | 257/66 |
| 6,274,888 B1 * | 8/2001 | Suzuki et al. | ................... | 257/72 |
| 6,300,175 B1 | 10/2001 | Moon | | |
| 6,322,625 B2 | 11/2001 | Im | | |
| 6,437,403 B1 * | 8/2002 | Noguchi | ........................ | 257/347 |
| 6,452,213 B1 * | 9/2002 | Kimura et al. | .................. | 257/66 |
| 6,720,578 B2 * | 4/2004 | Lee | ................................ | 257/64 |
| 6,727,514 B2 * | 4/2004 | Park et al. | ........................ | 257/20 |
| 6,815,269 B2 * | 11/2004 | Okumura | ..................... | 438/149 |
| 6,890,840 B2 * | 5/2005 | Isobe et al. | ..................... | 438/487 |
| 7,115,487 B2 * | 10/2006 | Kumomi et al. | ............. | 438/486 |
| 7,679,131 B1 * | 3/2010 | Kawasaki et al. | ............ | 257/327 |
| 2002/0100937 A1 | 8/2002 | Yamazaki et al. | | |
| 2002/0106586 A1 | 8/2002 | You | | |
| 2002/0182833 A1 | 12/2002 | Yang | | |
| 2004/0248386 A1 | 12/2004 | Nishitani et al. | | |

FOREIGN PATENT DOCUMENTS

| | | |
|---|---|---|
| EP | 0 565 231 A2 | 10/1993 |
| EP | 1 020 899 A1 | 7/2000 |

(Continued)

OTHER PUBLICATIONS

Office Action issued in Chinese Patent Application No. 200310109779.2 on Sep. 2, 2005.

(Continued)

*Primary Examiner* — Jay C Kim
(74) *Attorney, Agent, or Firm* — H.C. Park & Associates, PLC

(57) ABSTRACT

A thin film transistor including a lightly doped drain (LDD) region or offset region, wherein the thin film transistor is formed so that primary crystal grain boundaries of a polysilicon substrate are not positioned in the LDD or offset region.

8 Claims, 6 Drawing Sheets

FOREIGN PATENT DOCUMENTS

| | | |
|---|---|---|
| GB | 2 338 343 | 12/1999 |
| JP | 9-8314 | 1/1997 |
| JP | 11-168216 | 6/1999 |
| JP | 11-354800 | 12/1999 |
| JP | 2002-110544 | 4/2002 |
| KR | 2001-71526 | 7/2001 |
| WO | WO 97/45827 | 12/1997 |
| WO | WO 02/09192 | 1/2002 |

OTHER PUBLICATIONS

Wang, Mingxiang and Man Wong. "Characterization of an Individual Grain Boundary in Metal-Induced Laterally Crystallized Polycrystalline Silicon Thin-Film Devices." *IEEE Transactions on Electron Devices*. vol. 48, No. 8, Aug. 2001, pp. 1655-1660.

Cho, Hans S. et al. "Sequential Lateral Solidification of Ultra-Thin a-Si Films." *Mat. Res. Soc. Symp. Proc.* vol. 621, 2001, pp. 1-6.

English Abstract issued in WIPO Publication No. 2000/002251.

Office Action issued in Korean Patent Application No. 2002-80326 on Nov. 22, 2004.

Search Report issued in corresponding European Patent Application No. 03090437.9-1528 on Feb. 21, 2007.

Ishihara R et al., "Location Control of Large Grain Following Excimer-Laser Melting of Si Thin-Films", Mar. 1998, Tokyo, Japan, vol. 37, No. 3B, pp. 1071-1075.

Japanese Decision of Rejection issued on Aug. 5, 2008 in the corresponding Japanese Patent Application No. 2003-297912.

\* cited by examiner

THIN FILM TRANSISTOR WITH LDD/OFFSET STRUCTURE

CROSS-REFERENCE TO RELATED APPLICATIONS

This application claims the priority of Korean Patent Application No. 2002-80326, filed Dec. 16, 2002, in the Korean Intellectual Property Office, the disclosure of which is incorporated herein by reference.

BACKGROUND OF THE INVENTION

1. Field of the Invention

The present invention relates to a thin film transistor with an LDD region, and, more particularly, to a thin film transistor with an LDD region in which the electrical characteristics, such as the current characteristics, are superior.

2. Description of the Related Art

During fabrication of a thin film transistor (TFT) using polycrystalline silicon, bonding defects, such as dangling bonds, existing on crystal grain boundaries of the polycrystalline silicon included in an active channel region are known to act as a trap for electric charge carriers.

Therefore, the size, size uniformity, number, position, and direction of crystal grains not only have a fatal effect upon TFT characteristics such as threshold voltage (Vth), sub-threshold slope, charge carrier mobility, leakage current, and device stability, directly and indirectly, but they also have a fatal effect upon the uniformity of the TFTs, depending on the position of the crystal grains during fabrication of an active matrix display substrate using TFTs.

The number of fatal crystal grain boundaries (hereinafter referred to as "primary" crystal grain boundaries) included in active channel regions of TFTs on the whole substrate of a display device can be equivalent or changed according to the size of the crystal grains, inclination angle Θ, dimension of active channels (length (L), width (W)), and position of each TFT on the substrate (FIG. 1A and FIG. 1B).

As illustrated in FIG. 1A and FIG. 1B, if the maximum number of crystal grain boundaries is Nmax in the number of "primary" crystal grain boundaries included in the active channel regions for the size of crystal grains Gs, active channel dimension L×W, and inclination angle Θ, the number of "primary" crystal grain boundaries included in the active channel regions, according to the position of the TFT on a substrate or display device will be Nmax (3 in case of FIG. 1B) or Nmax−1 (2 in case of FIG. 1A), and uniformity of the most excellent TFT characteristics can be secured when Nmax "primary" crystal grain boundaries are included in active channel regions for all TFTs. That is, the more equal the number of crystal grain boundaries each TFT has, the more excellent uniformity a device obtains.

On the other hand, if the number of TFTs including Nmax "primary" crystal grain boundaries is equivalent to the number of TFTs including Nmax−1 "primary" crystal grain boundaries, it can be easily expected that uniformity is the worst, resulting in undesirable characteristics of TFTs on a TFT substrate or a display device.

As illustrated in FIG. 2A and FIG. 2B, polycrystalline or single crystalline particles are capable of forming large silicon grains on a substrate using a sequential lateral solidification (SLS) crystallization method, and it is reported that characteristics similar to the characteristics of TFTs fabricated of single crystalline silicon are obtained when fabricating a TFT using the large silicon grains.

However, numerous TFTs for driver and pixel arrays must be fabricated to fabricate an active matrix display.

For example, approximately one million pixels are made in fabricating an active matrix display having SVGA resolution, and one TFT is required in each pixel in the case of a liquid crystal display (LCD), and at least two or more TFTs are required in a display using an organic luminescent substance (for example, organic electroluminescent device).

Therefore, it is impossible to fabricate TFTs by growing a certain number of crystal grains, in a certain direction only, for the active channel regions of each of one million to two million, or more, TFTs.

As a method to realize this, technology for transforming amorphous silicon on the whole substrate into polycrystalline silicon, or crystallizing the selected region only on the substrate by the SLS crystallization method after depositing amorphous silicon by PECVD, LPCV, or sputtering, is disclosed, referring to FIG. 2A and FIG. 2B, as disclosed in PCT international patent WO 97/45827.

The selected region is also a considerably large region compared to an active channel region having a dimension of several μm×several μm. Furthermore, the size of the laser beam used in the SLS crystallization method is approximately several mm×dozens of mm, and the stepping and shifting of the laser beam or stage are essentially required to crystallize amorphous silicon of the whole region or selected region on a substrate, wherein misalignment between regions on which the laser beam is irradiated exists. Therefore, the number of "primary" crystal grain boundaries included in the numerous active channel regions of TFTs varies, and TFTs on the whole substrate, or in the driver region and pixel cell region, have unpredictable nonuniformity. The nonuniformity has a fatal adverse effect on the embodiment of an active matrix display device.

Furthermore, it is disclosed in U.S. Pat. No. 6,177,301 that a barrier effect of crystal grain boundaries in the direction of the electric charge carrier is minimized, in the case that the direction of the active channels is parallel to the direction of grown crystal grains by the SLS crystallization method when fabricating a TFT for LCD devices, including a driver and pixel array, by forming large silicon grains using the SLS crystallization method as illustrated in FIG. 3A. Therefore, TFT characteristics second to single crystalline silicon can be obtained. On the other hand, crystal grain boundaries in which TFT characteristics act as a trap of the electric charge carrier exist, and TFT characteristics are greatly deteriorated, in the case that the direction of the active channels is perpendicular to the growing direction of the crystal grains, as illustrated in FIG. 3B.

Actually, there are cases in which TFTs in driver circuits are generally inclined to TFTs in pixel cell regions at an angle of 90° when fabricating an active matrix display, wherein the uniformity of the device can be improved by fabricating TFTs in such a way that the direction of the active channel regions is inclined to the crystal grain growing direction in an angle of 30 to 60° to improve uniformity of characteristics between TFTs, as characteristics of each TFT are not greatly deteriorated, as illustrated in FIG. 3C.

However, there is a probability that fatal crystal grain boundaries are included in the active channel regions since this method also uses crystal grains having a limited size formed by the SLS crystallization method. Therefore, this method has problems in that unpredictable nonuniformity exists, causing differences of characteristics between TFTs.

SUMMARY OF THE INVENTION

The present invention is suggested to solve the foregoing and/or other problems, and it is an aspect of the present invention to provide an organic electroluminescent device with an LDD/offset region in which "primary" crystal grain boundaries of polysilicon are not included in a lightly doped drain (LDD)/offset region to improve electrical characteristics such as current characteristics.

Additional objects and advantages of the invention will be set forth in part in the description which follows and, in part, will be obvious from the description, or may be learned by practice of the invention.

In order to achieve the foregoing and/or other aspects, the present invention provides a thin film transistor comprising an LDD region or offset region, wherein the thin film transistor is formed so that "primary" crystal grain boundaries of a poly silicon substrate are not positioned in the LDD or offset region.

Also, the present invention provides a flat panel display device comprising a thin film transistor comprising an LDD region or offset region, wherein the thin film transistor is formed so that "primary" crystal grain boundaries of a poly silicon substrate are not positioned in the LDD or offset region.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1A:
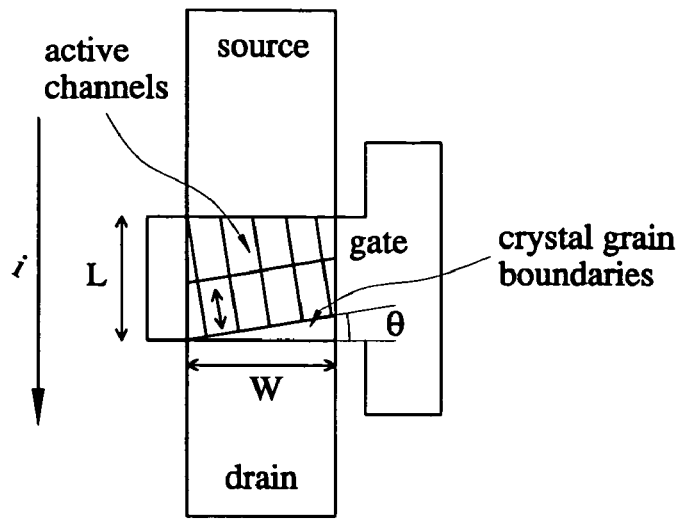
FIG. 1A is a plan figure schematically illustrating a TFT in which the number of fatal crystal grain boundaries for the size of equal crystal grains Gs, and the dimension of active channels L×W, is 2.
Figure 1B:
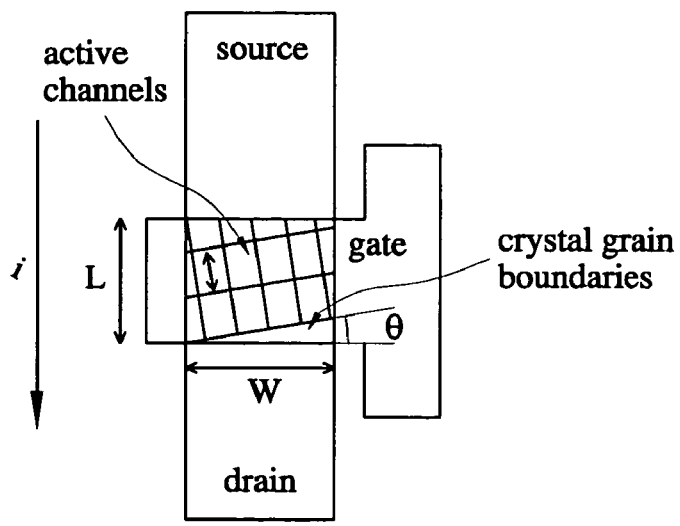
FIG. 1B is a plan figure schematically illustrating a TFT in which the number of fatal crystal grain boundaries is 3.
Figure 2A:
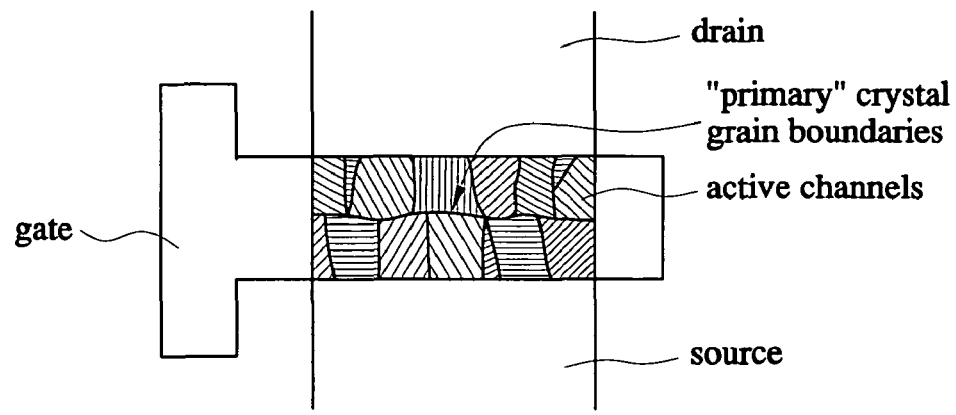
FIG. 2A and FIG. 2B are plan figures schematically illustrating active channels of TFTs including silicon grains having a large grain size formed by the SLS crystallization method.
Figure 2B:
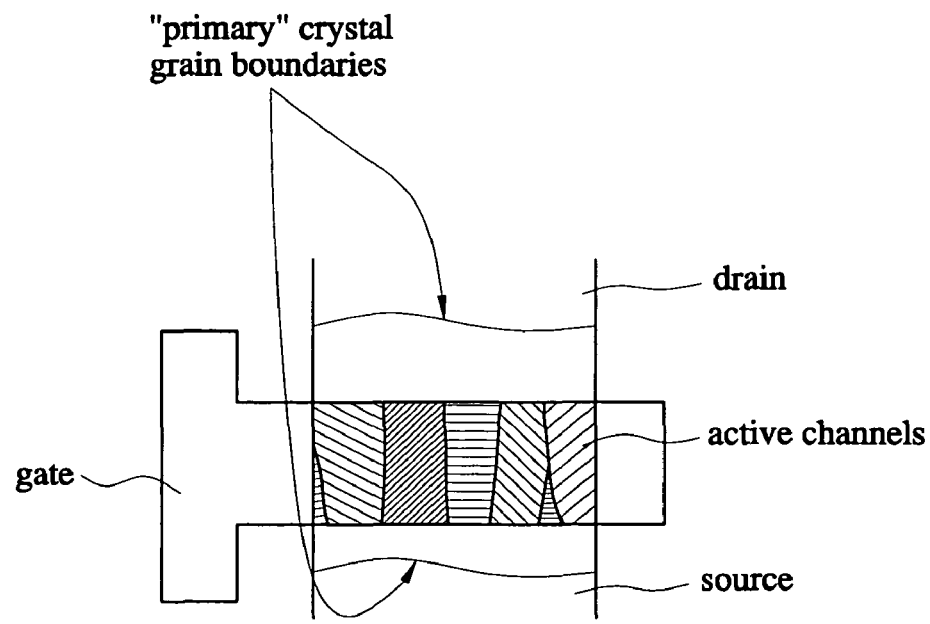
Figure 3A:
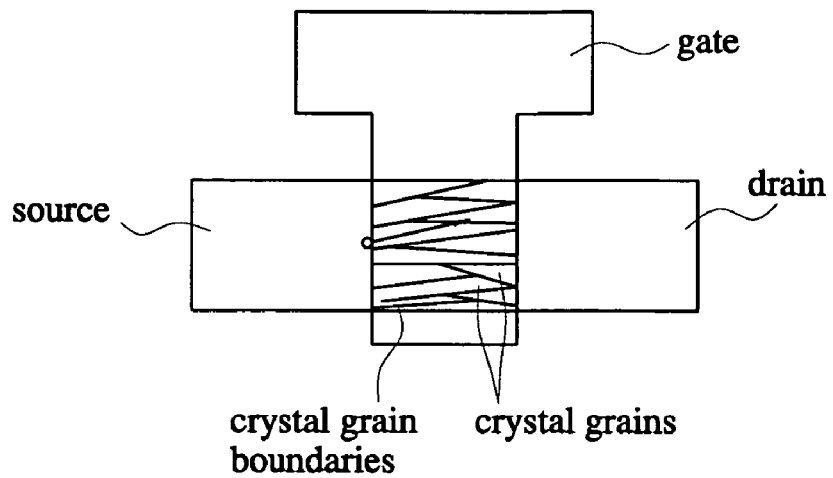
FIG. 3A to FIG. 3C are plan figures schematically illustrating active channels of TFTs fabricated according to other related art.
Figure 3B:
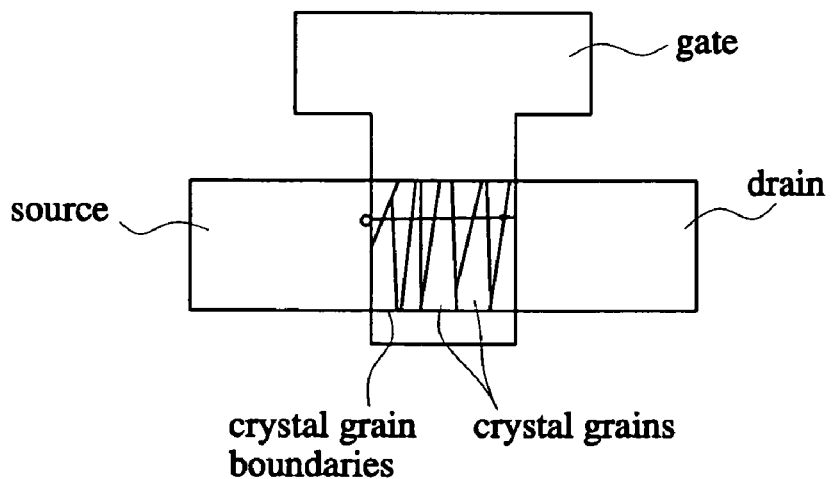
Figure 3C:
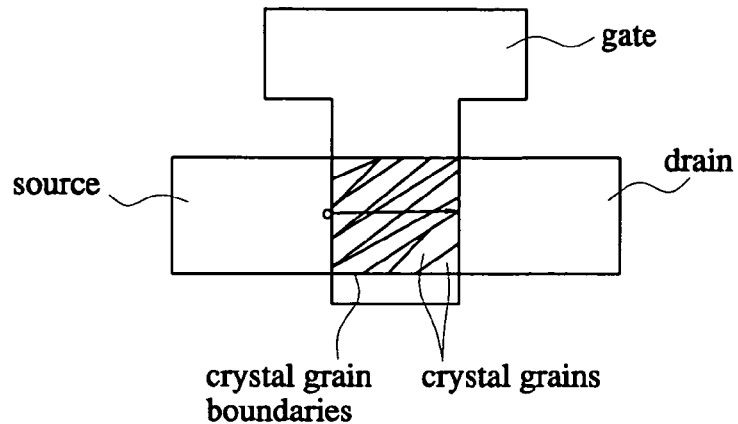

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Crystal grain boundaries are formed between adjacent crystal grains due to a limited size of crystal grains if crystal grains of polycrystalline silicon having an important effect on TFT characteristics, directly and indirectly, during fabrication of TFT for active matrix displays are large and regularized for improvement of the TFT characteristics.

In the present invention, "crystal grain size" means the confirmable distance between crystal grain boundaries, and is generally defined as the distance between crystal grain boundaries belonging to the ordinary error range.

Particularly, crystal grain boundaries have a fatal effect on TFT characteristics when crystal grain boundaries exist in active channel regions. "Primary" crystal grain boundaries, in which an inclination angle of the crystal grain boundaries to a direction perpendicular to an active channel direction is $-45°\leqq\Theta\leqq45°$, become an inevitable defect due to the limitation of process accuracy when forming a polycrystalline silicon thin film.

Figure 4:
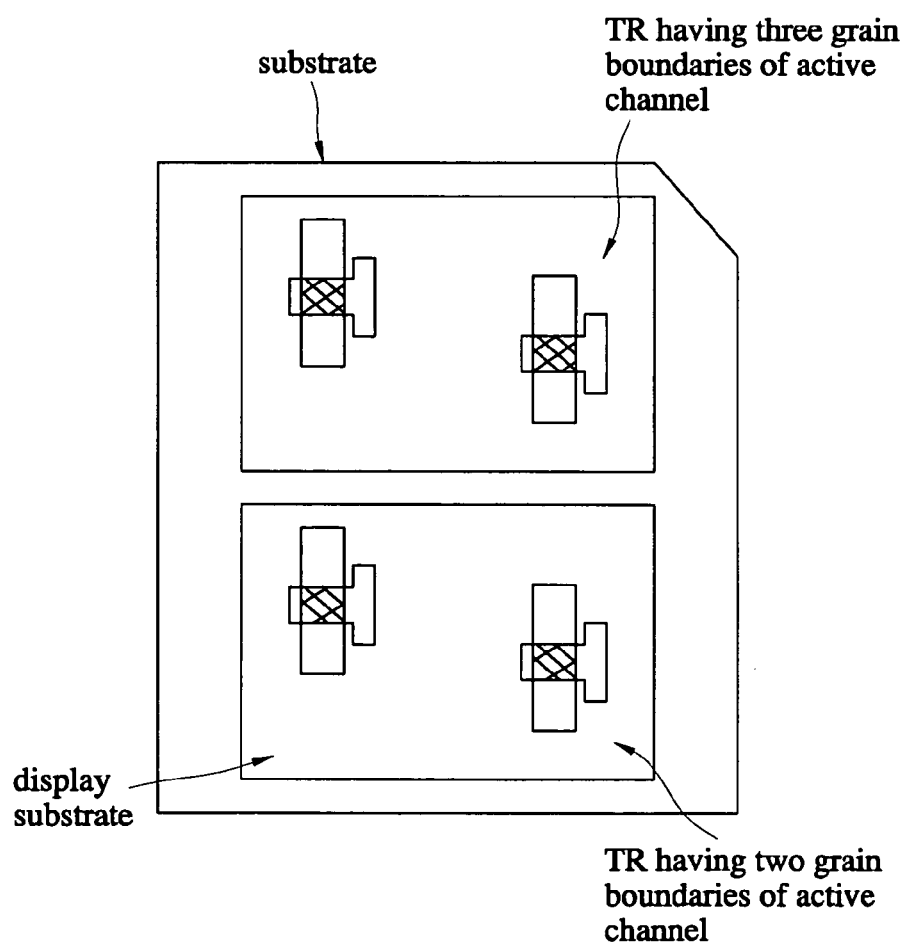
FIG. 4 is a schematic drawing indicating that the number of fatal crystal grain boundaries capable of having a fatal effect on the characteristics of a TFT fabricated on a driver circuit substrate or display can be varied depending on the position of the TFT.

Furthermore, the number of "primary" crystal grain boundaries included in active channel regions of a TFT fabricated on a driver circuit substrate or display substrate can be varied depending on the size and direction of the crystal grains and the dimensions of the active channels as illustrated in FIG. 4. Therefore, TFTs and displays that are fabricated have nonuniform characteristics, and can not be evenly driven.

TFT characteristics are affected by the "primary" crystal grain boundaries when the "primary" crystal grain boundaries exist in the LDD region in TFTs having an LDD structure stated in an embodiment of the present invention.

Generally, an offset region refers to a region that is not doped between the source electrode and the drain electrode, and leakage current can be cutoff by interposition of the offset region. Furthermore, off current, that is, leakage current, can be reduced in a thin film transistor by adding an LDD region to the offset region through low density ion doping of impurities.

Figure 5:
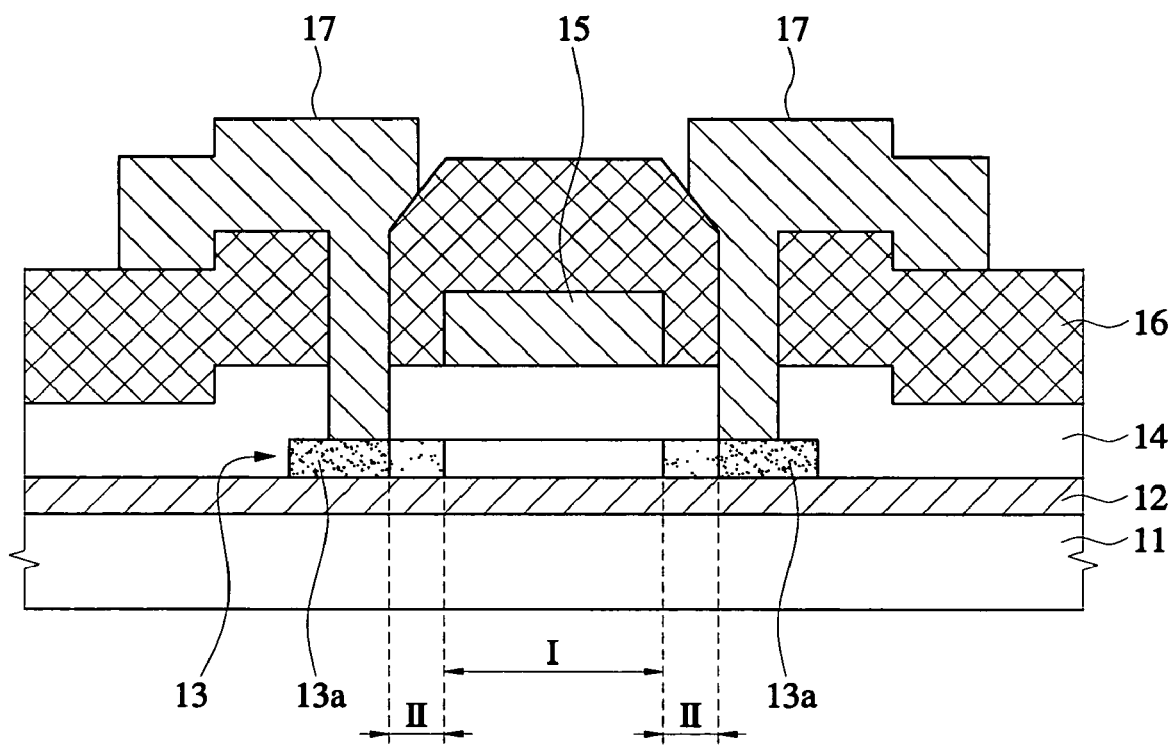
FIG. 5 is a cross sectional view of a thin film transistor having an offset or LDD structure.

FIG. 5 is a cross sectional view of a thin film transistor having an offset region or LDD structure.

Referring to FIG. 5, a thin film transistor with an offset region or LDD structure comprises a buffer layer 12, activation layer 13, and gate insulation film 14 which are sequentially formed on a substrate 11; a conductive gate electrode 15 which is formed on the buffer layer 12, activation layer 13 and gate insulation film 14; a passivation layer 16 that is formed over the surface of the gate insulation film 14; contact holes which are formed on the gate insulation film 14 and the passivation layer 16; a conductive layer which is formed over the surface of the passivation layer 16; and drain and source electrodes 17 which are formed by patterning the conductive layer.

Furthermore, drain and source regions 13a, doped with high concentrated impurities, are formed on the activation layer 13, a channel region I is formed in the activation layer 13 of the lower part of the gate electrode 15, and an LDD region II, doped with low concentrated impurities, is formed between the drain region 13a and the channel region, and between the source region 13a and the channel region.

Generally, when the activation layer 13 is formed by crystallizing amorphous silicon, thereby patterning polycrystalline silicon, crystal grain boundaries are formed in the polycrystalline silicon as described above, and, particularly, the "primary" crystal grain boundaries are deeply associated with the electrical characteristics of the TFT. That is, they greatly influence the driving current, as the "primary" crystal grain boundaries function as a barrier of current flowing from source to drain.

In an embodiment of the present invention, "primary" crystal grain boundaries of polysilicon forming the activation layer 13 are not positioned in the LDD region II, formed to prevent leakage current, so that characteristics of leakage current are improved.

Figure 6:
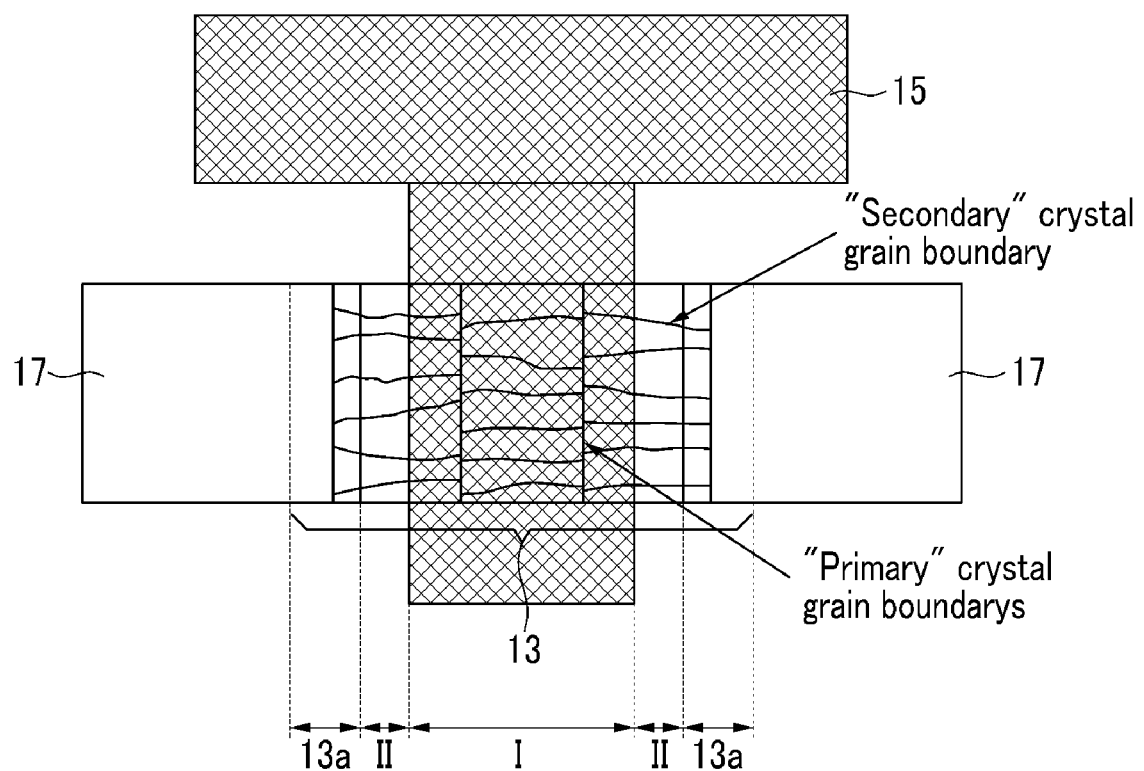
FIG. 6 is a plan figure schematically illustrating a thin film transistor having an offset or LDD structure.

FIG. 6 is a plan figure schematically illustrating a thin film transistor having an offset region, or LDD structure.

Referring to FIG. 6, a thin film transistor can be formed by adjusting the width between the "primary" crystal grain boundaries formed on polysilicon so that the "primary" crystal grain boundaries are not formed on the LDD region II.

Furthermore, an activation layer 13 can be formed so that the "primary" crystal grain boundaries are not included in the LDD region II. In this case, the width between "primary" crystal grain boundaries of polysilicon forming the activation layer 13 should be wider than that of the LDD region II.

Therefore, a thin film transistor according to an embodiment of the present invention has improved device characteristics, and it has superior electrical characteristics, such as leakage current characteristics. A semiconductor device or display device can be used as the device, and a liquid crystal device (LCD) or organic electroluminescent (EL) device is preferably used as a display device.

It is preferable that the polysilicon forming the activation layer is formed by the SLS method.

A thin film transistor according to an embodiment of the present invention is capable of providing TFTs with superior electrical characteristics and improved reliability.

Although a few embodiments of the present invention have been shown and described, it would be appreciated by those skilled in the art that changes may be made in these embodiments without departing from the principles and spirit of the invention, the scope of which is define in the claims and their equivalents.

What is claimed is:

1. A thin film transistor (TFT) comprising:
a gate electrode; and
a polysilicon substrate comprising:
  a channel region directly overlapping with the gate electrode in a top view;
  lightly doped drain (LDD) or offset regions disposed in contact with opposing sides of the channel region;
  source and drain regions disposed in contact with the LDD or offset regions, such that the LDD or offset regions and the channel region are disposed between the source and drain regions; and
  primary crystal grain boundaries, wherein,
the primary crystal grain boundaries are disposed in the channel region and the source and drain regions, but are not disposed in the LDD or offset regions,
the source and drain regions are formed through a single ion implantation process,
a thickness of the channel region is substantially identical to a thickness of the source and drain regions, and
the channel region and the source and drain regions are disposed directly in the same plane.

2. The thin film transistor according to claim 1, wherein the polysilicon substrate is formed by a sequential lateral solidification (SLS) method.

3. The thin film transistor according to claim 1, wherein the thin film transistor is used in an LCD (liquid crystal display) or organic EL (electroluminescent) device.

4. The thin film transistor according to claim 1, wherein the primary crystal grain boundaries are substantially perpendicular to a current direction between the source and drain regions of the thin film transistor.

5. A flat panel display device comprising:
a thin film transistor comprising:
  a gate electrode; and
  a polysilicon substrate comprising:
    a channel region directly overlapping with the gate electrode in a top view;
    offset regions disposed in contact with opposing sides of the channel region;
    source and drain regions disposed in contact with the offset regions, such that the offset regions and the channel region are disposed between the source and drain regions; and
    primary crystal grain boundaries, wherein,
  the primary crystal grain boundaries are disposed in the channel region and the source and drain regions, but are not disposed in the offset regions,
  the source and drain regions are formed through a single ion implantation process,
  a thickness of the channel region is substantially identical to a thickness of the source and drain regions, and
  the channel region and the source and drain regions are disposed directly in the same plane.

6. The flat panel display device according to claim 5, wherein the polysilicon substrate is formed by a sequential lateral solidification (SLS) method.

7. The flat panel display device according to claim 5, wherein the thin film transistor is used in an LCD (liquid crystal display) or organic EL (electroluminescent) device.

8. The flat panel display device according to claim 5, wherein the primary crystal grain boundaries are substantially perpendicular to a current direction between the source and drain regions of the thin film transistor.

* * * * *